United States Patent [19]
Irrinki et al.

[11] Patent Number: 5,784,328
[45] Date of Patent: Jul. 21, 1998

[54] MEMORY SYSTEM INCLUDING AN ON-CHIP TEMPERATURE SENSOR FOR REGULATING THE REFRESH RATE OF A DRAM ARRAY

[75] Inventors: V. Swamy Irrinki, Milpitas; Ashok Kapoor; Raymond Leung, both of Palo Alto; Alex Owens, Los Gatos; Thomas R. Wik, Livermore, all of Calif.

[73] Assignee: LSI Logic Corporation, Milpitas, Calif.

[21] Appl. No.: 779,999

[22] Filed: Dec. 23, 1996

[51] Int. Cl.$^6$ ................................................. G11C 7/00
[52] U.S. Cl. ........................ 365/222; 365/211; 365/149
[58] Field of Search .......................... 365/222, 211, 365/149, 183

[56] References Cited

U.S. PATENT DOCUMENTS

| | | | |
|---|---|---|---|
| 4,057,788 | 11/1977 | Sage | 365/174 |
| 4,633,438 | 12/1986 | Kume et al. | 365/51 |
| 4,661,929 | 4/1987 | Aoki et al. | 365/189 |
| 4,715,014 | 12/1987 | Tuvell et al. | 365/185 |
| 4,910,709 | 3/1990 | Dhong et al. | 365/149 |
| 4,935,896 | 6/1990 | Matsumura et al. | 365/187 |
| 5,021,999 | 6/1991 | Kohda et al. | 365/168 |
| 5,119,330 | 6/1992 | Tanagawa | 365/168 |
| 5,159,570 | 10/1992 | Mitchell et al. | 365/185 |
| 5,172,338 | 12/1992 | Mehrotra et al. | 365/185 |
| 5,276,843 | 1/1994 | Tillinghast et al. | 395/425 |
| 5,278,796 | 1/1994 | Tillinghast et al. | 365/211 |
| 5,282,162 | 1/1994 | Ochii | 365/189.01 |
| 5,283,761 | 2/1994 | Gillingham | 365/189.07 |
| 5,351,210 | 9/1994 | Saito | 365/189.01 |
| 5,357,464 | 10/1994 | Shukuri et al. | 365/185 |
| 5,394,362 | 2/1995 | Banks | 365/189.01 |
| 5,459,686 | 10/1995 | Saito | 365/149 |
| 5,521,865 | 5/1996 | Ohuchi et al. | 365/185.22 |
| 5,532,955 | 7/1996 | Gillingham | 365/149 |
| 5,596,534 | 1/1997 | Manning | 365/189.09 |
| 5,600,591 | 2/1997 | Takagi | 365/184 |
| 5,652,729 | 7/1997 | Iwata et al. | 365/222 |

OTHER PUBLICATIONS

Abbott, et al., "A 4K MOS Dynamic Random–Access Memory," IEEE Journal of Solid–State Circuits, vol. SC-8, No. 5, Oct. 1973, pp. 292–298.

*Primary Examiner*—David C. Nelms
*Assistant Examiner*—Hien Nguyen
*Attorney, Agent, or Firm*—Conley, Rose & Tayon; B. Noel Kivlin

[57] ABSTRACT

A DRAM memory array including a temperature sensor for adjusting a refresh rate depending upon temperature. The DRAM memory array includes a plurality of memory cells, each configured to allow storage and retrieval of more than two discrete memory states. A refresh circuit is coupled to the memory array for periodically refreshing the discrete storage state of each memory cell. The temperature sensor is situated on the same semiconductor die upon which the memory array is fabricated, and generates a signal indicative of the temperature of the semiconductor die. A control circuit receives the signal from the temperature sensor and responsively generates a refresh rate signal which is provided to control the refresh rate of the refresh circuit. In one specific implementation, a ROM look-up table is coupled to the control circuit and includes a plurality of entries which indicate the desired refresh rates for particular temperatures. By controlling the refresh rate dependent upon the temperature of the semiconductor die, proper state retention is ensured within each of the memory cells while allowing performance to be optimized.

18 Claims, 4 Drawing Sheets

MEMORY SYSTEM INCLUDING AN ON-CHIP TEMPERATURE SENSOR FOR REGULATING THE REFRESH RATE OF A DRAM ARRAY

BACKGROUND OF THE INVENTION

1. Field of the Invention

This invention relates to the field of solid state devices for information storage, and in particular to a method and structure for regulating the refresh rate and for storing multilevel logic values in a dynamic random access memory (DRAM).

2. Description of the Related Art

Memory devices store and retrieve large quantities of digital data at electronic speeds. Early digital computers used magnetic cores as the devices in fast-access memories. With the introduction of semiconductor memory chips in the late 1960s, magnetic cores began to be replaced by integrated circuits which implement a much higher-density memory function. This not only increased the performance capabilities of the memory, but also drastically decreased its cost. By the end of the 1970s, magnetic core memories had been completely displaced as high-speed memory devices.

Memory capacities in digital systems are commonly expressed in terms of bits (binary digits), since a separate device or circuit is used to store each bit of data. Each storage element is referred to as a cell. Memory capacities are also sometimes stated in terms of bytes (8 or 9 bits) or words (arbitrarily defined, but commonly 16–80 bits). Every bit, byte, or word is stored in a particular location, identified by a unique numeric address. Only a single bit, byte, or word is stored or retrieved during each cycle of memory operation.

The units of memory storage capacity are typically kilobits and megabits (or kilobytes and megabytes). Since memory addressing is based on binary codes, capacities that are integral powers of 2 are typically used. As a result, a memory device with a 1-kbit capacity can actually store 1024 bits, and a 64-kbyte device can store 65,536 bytes.

In digital computers, the number of memory bits is usually 100 to 1000 times greater than the number of logic gates, which implies that the memory cost per bit must be kept very low. In addition, it is desirable for the memory devices to be as small as possible (since this will allow the highest density of cells on a chip), to operate at a high speed, to have a small power consumption, and to operate reliably. To achieve this end, memory cells are designed to be as simple and compact as possible. Typically, the cell itself is not capable of outputting digital data in an electrical form compatible with the requirements of the remainder of the system. To restore the electrical characteristics of the cell's outputted data to adequate values, properly designed peripheral circuits (e.g. sense amplifiers, memory registers, and output drivers) are necessary. These circuits are designed to be shared by many memory cells. The trade-off thus made is that of a less robust output signal from the cell, in exchange for a simple, compact memory cell design.

The most flexible digital memories are those that allow for data storage (hereafter, writing) as well as data retrieval (hereafter, reading). Memories in which both of these functions can be rapidly and easily performed, and whose cells can be accessed in random order (independent of their physical locations), are referred to as random-access memories (RAMs). Read-only memories (ROMs) are those in which only the read operation can be performed rapidly. Entering data into a ROM is referred to as programming the ROM. This operation is much slower than the writing operation used in RAMs.

The storage cells in a typical semiconductor memory are arranged in an array consisting of horizontal rows and vertical columns. Each cell shares electrical connections with all the other cells in its row, and column. The horizontal lines connected to all the cells in the row are called word lines, and the vertical lines (along which data flows into and out of the cells) are referred to as data lines. Each cell therefore has a unique memory location, or address, which can be accessed at random through the selection of the appropriate word and data line. Some memories are designed so that all the cells in a row are accessed simultaneously. This array configuration of semiconductor memories lends itself well to the regular structured designs which are favored in VLSI.

There are a number of important circuits on the periphery of the array. One such peripheral circuit is the address decoder. This circuit allows a large number of word and data lines to be accessed with the fewest number of address lines. Address decoders for this purpose have $2^n$ output lines, with a different one selected for each different n-bit input code. In later generations of memory circuits, address multiplexing was integrated on some memory chips to reduce the number of address pins by half.

Another peripheral circuit is the read/write control circuitry. This circuitry determines whether data is to be written into or read from the memory. Because such circuits also amplify and buffer the data signals retrieved from the cells, one of the important circuits in this subsystem is the sense amplifier. In dynamic memories that need periodic data refreshing, refresh circuitry may also be provided.

Recently, additional peripheral circuits have been added to the basic memory organization structure. These circuits serve mainly to improve the manufacturability and testability of the chips. Those designed to increase manufacturability include redundancy circuits and error-correction circuits. Redundancy circuits allow some defective chips to be salvaged, while self-testing circuits reduce testing time. Error-detection and correction techniques involve the addition of parity bits to allow the system to detect bad data, accomplish parity checking, and in some cases provide correction of the data errors.

Most RAMs have only one input-data lead and one output-data lead (or a single combined input/output lead). Writing into and reading from such RAMs is done one bit at a time. Other RAMs have a number of input- and output-data leads, with the number determined by the word length of the system's data bus. ROMs, on the other hand, are typically organized so that the number of output-data leads is the same as the number of lines on the data bus. ROMs are programmed word by word and are read from in the same manner.

In semiconductor RAMs, information is stored on each cell either through the charging of a capacitor or the setting of the state of a bi-stable flip-flop circuit. With either method, the information on the cell is destroyed if the power is interrupted. Such memories are therefore referred to as volatile memories.

When the charge on a capacitor is used to store data in a semiconductor-RAM cell, the charge needs to be periodically refreshed, since leakage currents will remove it in a few milliseconds. Volatile memories based on this storage mechanism are known as dynamic RAMs, or DRAMs. The leakage from a capacitor in a DRAM cell is typically dependent upon temperature, and therefore the refresh rate of a DRAM cell is typically set to ensure proper logic state retention during worst case temperature conditions. During normal operating conditions, however, this refresh rate may limit the overall performance of the memory unnecessarily. It would be desirable to provide a DRAM memory structure wherein overall performance may be enhanced. It is further desirable to provide a DRAM memory structure which allows for increased bit storage density and reduced cost per bit.

SUMMARY OF THE INVENTION

The problems outlined above are in large part solved by a memory system including an on-chip temperature sensor for regulating the refresh rate of a DRAM cell in accordance with the present invention. In one embodiment, a DRAM memory array is provided including a plurality of memory cells, each configured to allow storage and retrieval of more than two discrete memory states. A refresh circuit is coupled to the memory array for periodically refreshing the discrete storage state of each memory cell. A temperature sensor is situated on the same semiconductor die upon which the memory array is fabricated, and generates a signal indicative of the temperature of the semiconductor die. A control circuit receives the signal from the temperature sensor and responsively generates a refresh rate signal which is provided to control the refresh rate of the refresh circuit. In one specific implementation, a ROM look-up table is coupled to the control circuit and includes a plurality of entries which indicate the desired refresh rates for particular temperatures. By controlling the refresh rate dependent upon the temperature of the semiconductor die, proper state retention is ensured within each of the memory cells while allowing performance to be optimized.

In one specific implementation, each memory cell of the memory array includes a storage transistor having a gate connected to a write transistor. When the write transistor is enabled, it is possible to store a charge quantity indicative of one of three or more logic states. A read transistor is connected to the channel of the storage transistor, and when the read transistor is enabled, the current which flows through the storage transistor is indicative of the stored charge quantity. An analog-to-digital (A/D) converter is coupled to the read transistor so as to sense a value indicative of the current and determine the state represented by the stored charge quantity. Since the additional logic states may be used to represent additional information bits, this memory circuit increases the number of bits that may be stored per memory cell, thereby increasing the storage density and reducing the cost per bit. The control circuit which causes the refresh rate to vary depending upon temperature advantageously ensures that proper state retention is maintained, which is particularly important for memory cells that store more than two logic states. The control circuit further accommodates good performance characteristics during normal or good operating conditions.

BRIEF DESCRIPTION OF THE DRAWINGS

Other objects and advantages of the invention will become apparent upon reading the following detailed description and upon reference to the accompanying drawings in which.

Figure 1:
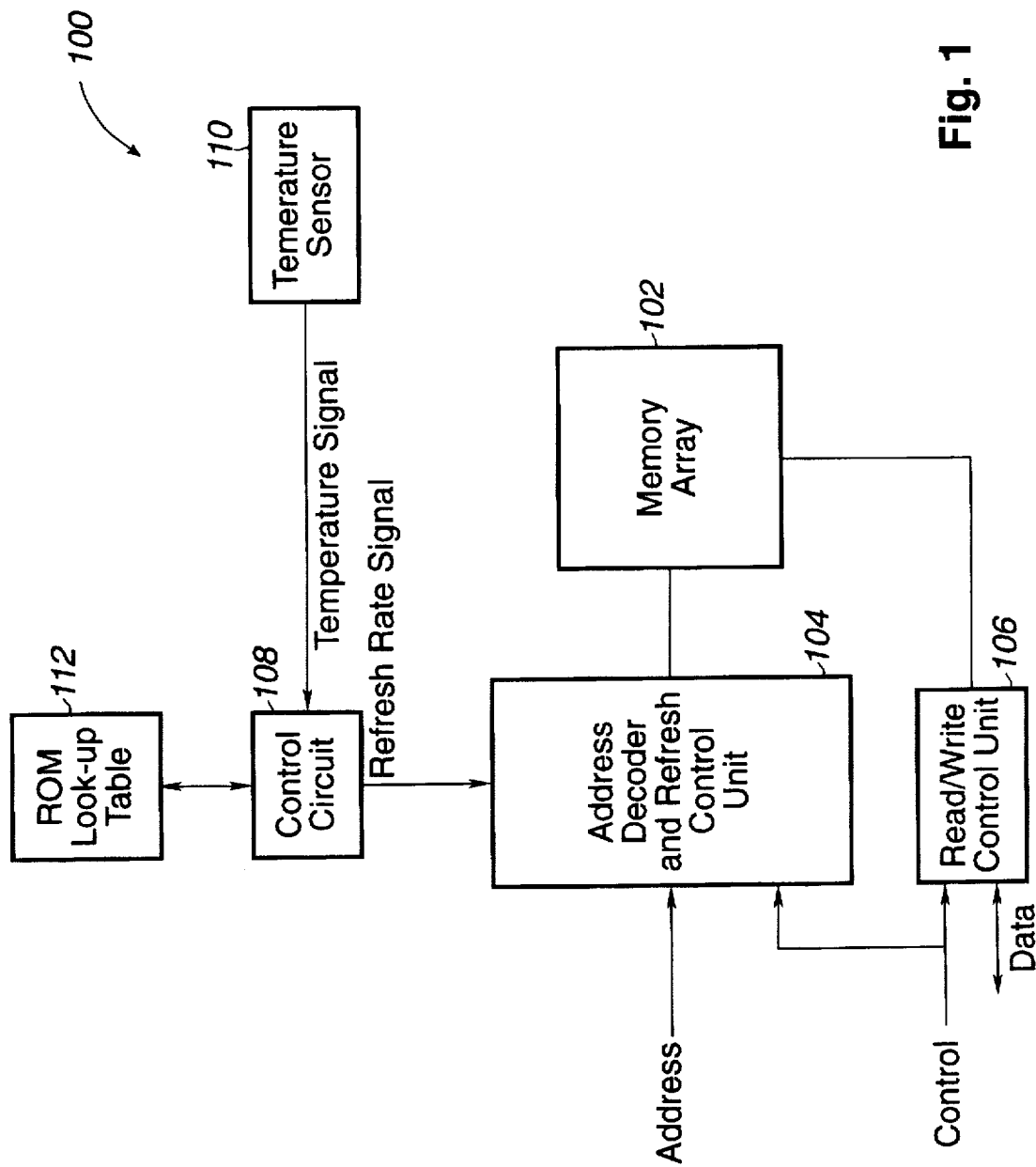
FIG. 1 is a block diagram of a memory system including an on-chip temperature sensor for regulating the refresh rate of a memory array.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a memory system 100 including an on-chip temperature sensor for regulating the refresh rate of a memory array in accordance with the present invention is shown. The memory system 100 includes a memory array 102 coupled to an address decoder and refresh control unit 104 and to a read/write control unit 106. A control circuit 108 is further coupled to address decoder and refresh control unit 104. A temperature sensor 110 and ROM look-up table 112 are finally shown coupled to control circuit 108.

In this embodiment, memory array 102 includes a plurality of DRAM memory cells. Address decoder and refresh control unit 104 is configured to perform address decoding functions and to refresh the cells of memory array 102. Read/write control unit 106 accommodates read and write operations of data associated with memory array 102.

Temperature sensor 110 is provided to sense a temperature of a semiconductor die on which memory array 102 is fabricated, and to generate a temperature signal indicative of such temperature. Control circuit 108 receives the temperature signal and generates a refresh rate signal which controls the refresh rate of the cells within memory array 102. That is, address decoder and refresh control unit 104 varies the refresh rate of the memory cells of memory array 102 depending upon the refresh rate signal from control circuit 108. For the specific implementation of FIG. 1, ROM look-up table 112 is provided to store a plurality of entries which each indicate a desired refresh rate for a particular temperature. Control circuit 108 is configured to periodically access ROM look-up table 112 in accordance with the temperature signal received from temperature sensor 110, and to update the refresh rate signal according to the ROM look-up table entry which corresponds to the current temperature. In one specific implementation, since the leakage of the memory cells forming memory array 102 decreases as temperature increases, the refresh rate is decreased as temperature increases.

Figure 2:
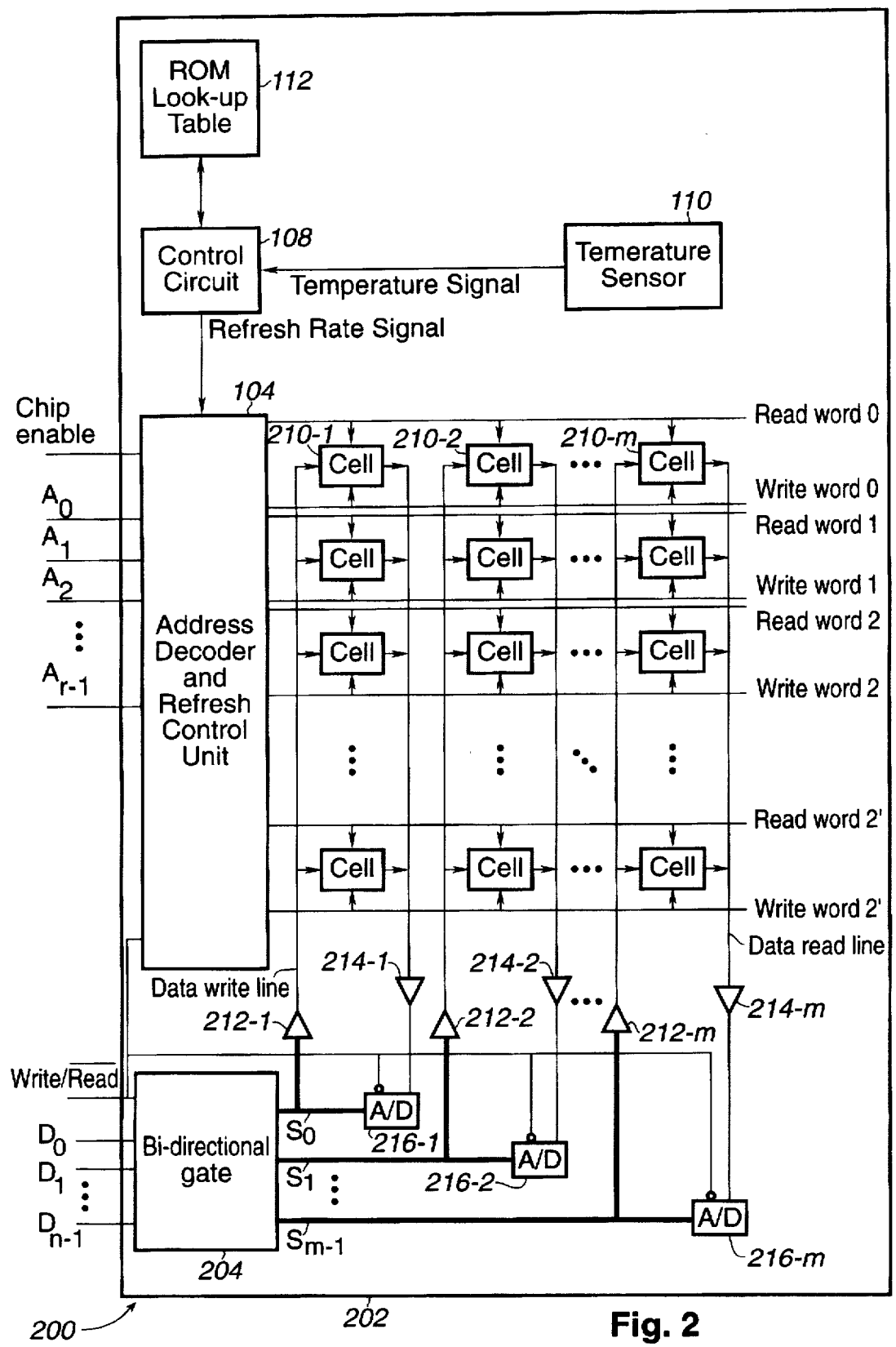
FIG. 2 is a block diagram of another embodiment of a memory system including an on-chip temperature sensor for regulating the refresh rate of a DRAM cell configured to store multiple level logic states.

Turning next to FIG. 2, a memory system 200 in accordance with another embodiment is shown wherein each cell of the memory array is configured to store more than two distinct logic states. Circuit portions that correspond to those of FIG. 1 are number identically for simplicity and clarity.

In this embodiment, memory system 200 has a ground plane 202 surrounding the chip circuitry which shields the circuitry from electromagnetic noise. Memory system 200 receives a chip enable signal, a read/write signal, and r address bit signals at an address decoder and refresh unit 104. During operation when the chip enable signal is asserted with the read/write signal indicating a read, address decoder and refresh unit 104 asserts one of 2, read word lines. Each of the read word lines is coupled to a row of memory cells. Each row of memory cells is also coupled by a write word line to address controller 206. When a read word line is asserted, the corresponding row of memory cells may be read. Similarly, when a write word line is asserted, the corresponding row of memory cells may be written.

Memory system 200 also has n bi-directional binary data lines ($D_0$–$D_{n-1}$) connected to a bi-directional gate 204. Bi-directional gate 204 is coupled to receive the read/write signal and is further coupled to m data paths which carry multi-value logic signals ($S_0$–$S_{m-1}$). Each of the data paths can be driven by either bi-directional gate 204 or one of a set of analog-to-digital (A/D) converters 216-1 through 216-m (referred to collectively as A/D converters 216). Each of the data paths provides input to one of a set of data line drivers 212-1 through 212-m (referred to collectively as data line drivers 212). Data line drivers 212 each serve to convert the multi-value logic signal into a multi-level voltage signal which is coupled by a data write line to a corresponding column of memory cells. Each column of memory cells is also coupled by a data read line to one of a set of sense amplifiers 214-1 through 214-m, which in turn provides input to one of the A/D converters 216.

An exemplary memory read operation is now described. Consider a situation in which the address bits are all zero, the write/read control line indicates a read operation, and the chip enable signal is asserted. Upon occurrence of this situation, address decoder and refresh unit 104 asserts the read word line for word 0 (i.e. "Read word 0"). This causes cells 210-1 through 210-m to pass a multi-level data signal indicative of information stored in the corresponding cells to the read data lines which are coupled to sense amplifiers 214. Sense amplifiers 214 detect and amplify the multi-level data signals and pass the amplified signals to A/D converters 216. A/D converters 216 convert the amplified signals to m multi-value logic signals ($S_0$–$S_{m-1}$) which are coupled to bi-directional gate 204. Bi-directional gate 204 converts the m multi-value logic signals ($S_0$–$S_{m-1}$) to n binary digital signals, and drives the n bits on data lines $D_0$–$D_{n-1}$. In this manner, a multi-value logic state stored in each cell may be read.

In one specific implementation, the cells being read are refreshed concurrent with the read operation (in addition to the normal refresh operations, as described below). For the implementation of FIG. 2, data drivers 212 convert the m multi-value logic signals ($S_0$–$S_{m-1}$) into m corresponding multi-level voltage signals and drive them on the data write lines which are coupled to cells 210. If at this time the word write line for word 0 is asserted, cells 210 store the m multi-level voltage signals. In this way, the content of cells 210 can be refreshed every time they are read.

The effectuation of memory write operations is similar. For example, if the address bits are all zero and the write/read control line indicates a write operation when the chip enable signal is asserted, then address decoder and refresh unit 104 asserts the write word line for word 0. Bi-directional gate 204 receives data from the bi-directional binary data lines $D_0$–$D_{n-1}$ and converts the data into m multi-value logic signals which are driven onto the m data paths. The A/D converters 216 for driving each of the m data paths are disabled while the write/read control line indicates a write operation. Data line drivers 212 convert the input m multi-value logic signals into m multi-level voltage signals and drives the data write lines coupled to the selected cells 210. Having the word write line asserted causes the multi-level signal to be stored in cells 210. It is noted that in the embodiment of FIG. 2, bi-directional gate 204, data line drivers 212, sense amplifiers 214, and A/D converters 216 collectively form a read/write control circuit. Other embodiments may employ different implementations of read/write circuitry.

Address decoder and refresh unit 104 further includes refresh circuitry to read and refresh the contents of each memory cell within a given time interval. The refresh cycles can be implemented in many ways, one of which is to have them happening continuously while the chip is not enabled. In this implementation method, bi-directional gate 204 is disabled and the A/D converters 216 are enabled during refresh cycles. Address decoder and refresh unit 206 may employ a counter which sequentially asserts each word line, causing a read operation similar to that described previously. In order to assure that each memory cell is refreshed, the chip must spend a specified fraction of a given time interval in the disabled mode. The refresh circuitry may thus force the memory circuit in a disabled mode (i.e., prevent a write or read operation) to ensure that the cells 210 are refreshed appropriately. The memory system 200 of FIG. 2 includes control circuit 108, temperature sensor 110, and ROM look-up table 112 which operate to adjust the refresh rate of address decoder and refresh control unit 104 in a manner as described previously with reference to FIG. 1.

Figure 3:
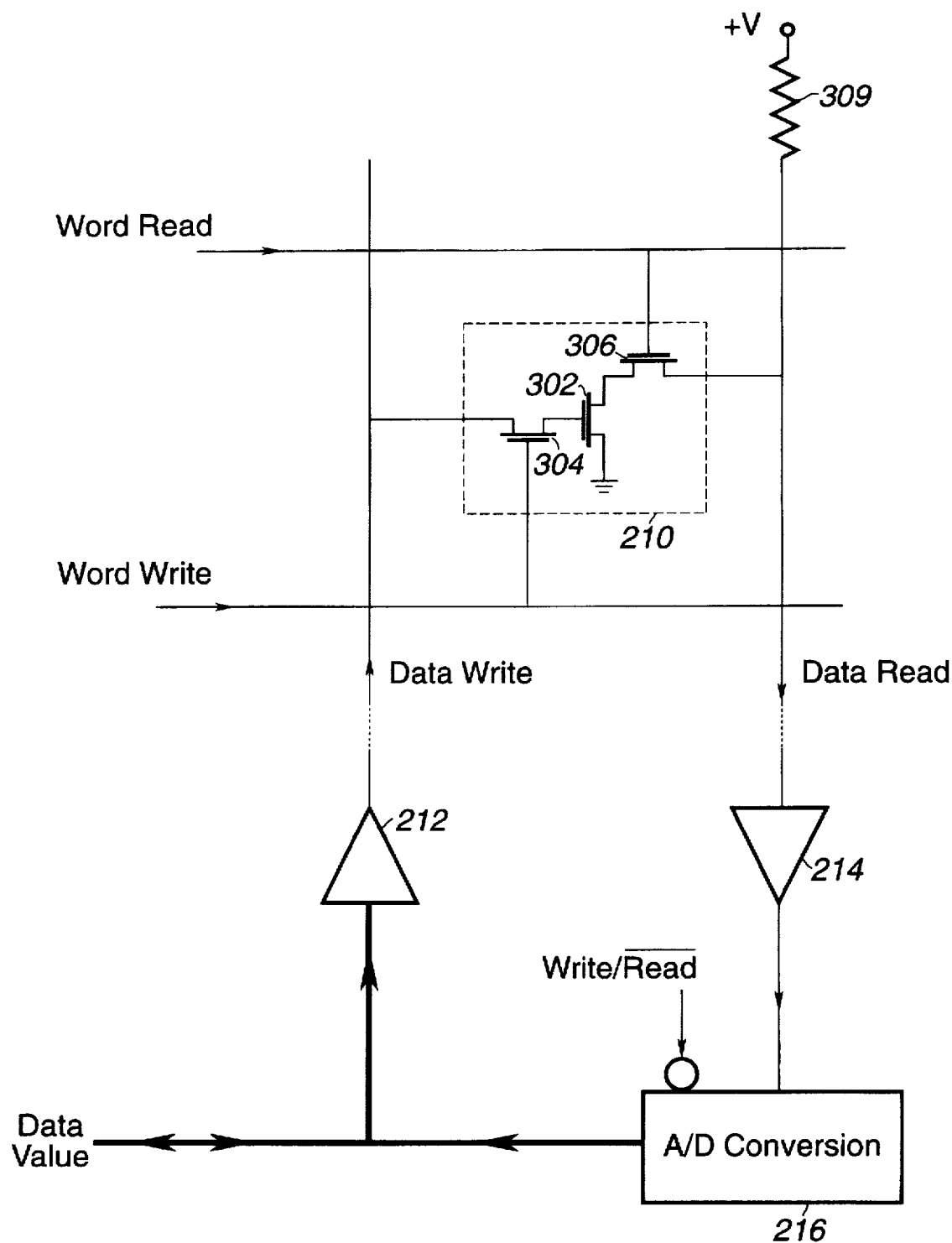
FIG. 3 is a block diagram illustrating the function of a memory cell and one embodiment of read/write circuitry for the memory system of FIG. 2.

Turning now to FIG. 3, portions of memory system 200 are shown in greater detail. Circuit portions that correspond to those of FIG. 2 are numbered identically for simplicity and clarity. FIG. 3 illustrates a memory cell 210 which is exemplary of each of the cells of FIG. 2. Memory cell 210 includes a storage transistor 302, a write transistor 304, and a read transistor 306. The gate of storage transistor 302 is coupled via write transistor 304 to the data write line. Write transistor 304 provides an electrically conductive path when the word write line is asserted, and an open circuit when the word line is de-asserted. Since the gate of storage transistor 302 has a significant capacitance, an electric charge can be stored on the gate by turning write transistor 304 on, passing a current through write transistor 304 to the gate of storage capacitor 302, and subsequently turning write transistor 304 off. The charge stored on the gate alters the conductivity of the channel of storage transistor 302. One terminal of storage transistor 302 is connected to ground, and the other terminal is connected to read transistor 306. Read transistor 306 provides an electrically conductive path when the word read line is asserted. The conductivity of storage transistor 302 can then be detected using the data read line. A pull-up resistance 309, which may be implemented with a pull-up transistor, effects a voltage on the data read line which is indicative of the charge stored on the gate of storage transistor 302. Sense amplifier 214 buffers and amplifies this voltage for A/D converter 216. A/D converter 216 is enabled when the write/read signal indicates a read operation, and disabled when a write operation is indicated. When enabled, A/D converter 216 converts the amplified signal into a multi-value logic signal which is one of $S_0$–$S_{m-1}$. Data line driver 212 converts the multi-value logic signal into a multi-level voltage on the data write line.

Figure 4:
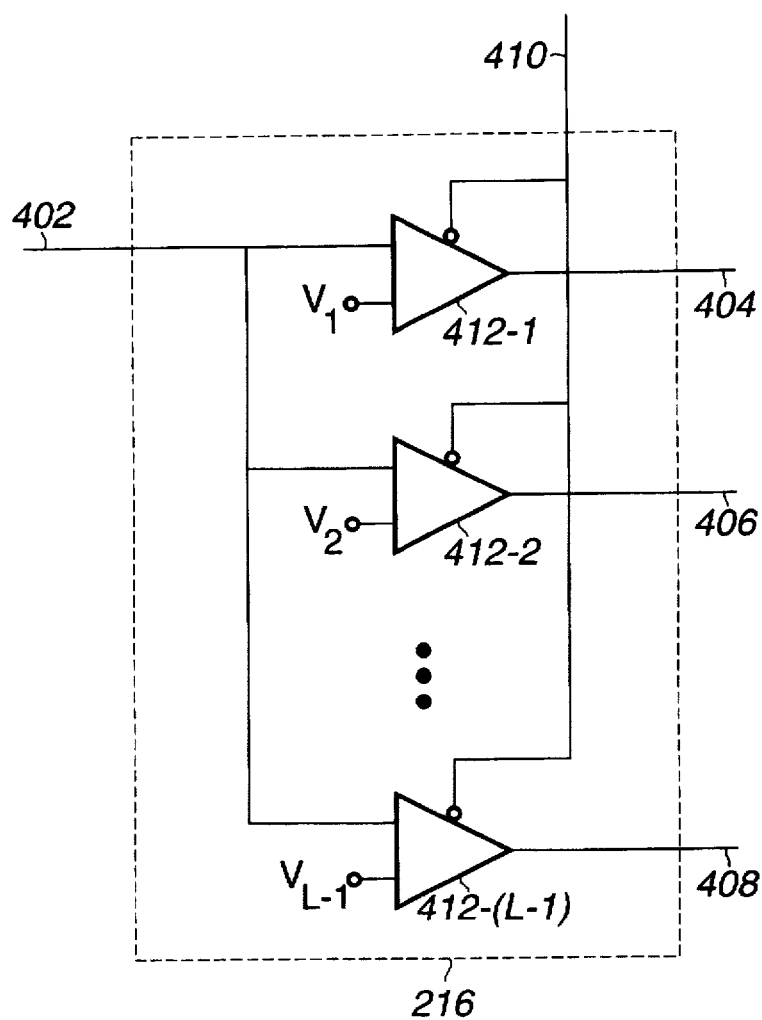
FIG. 4 is a block diagram of an analog to digital converter capable of sensing more than two stored signal states.

FIG. 4 shows a block diagram of one embodiment of A/D converter 216. A/D converter 216 receives an input signal 402 and drives a digital output signal on L-1 output lines 404–408 (which form a data path to carry one of the multi-value logic signals $S_0$–$S_{m-1}$) when enabled by a write/read signal 410. During operation, asserting write/read signal 410 drives the output lines to a high impedance state.

A/D converter 400 is comprised of L-1 comparators 412, where L is the number of logic states which can be stored in a memory cell 308. Each comparator receives one of L-1 reference voltages which demarcate the voltage regions representative of each logic state. For example, comparator 412-1 compares input signal 402 to reference voltage $V_1$, and (if enabled) asserts output line 404 when input signal 402 exceeds the reference voltage. The L-1 output lines accordingly have L possible states, ranging from having no lines asserted to having L-1 lines asserted.

Turning back to FIG. 2 with continued reference to FIG. 4, in one exemplary configuration of memory system 200 wherein each memory cell stores one of four discrete states, bi-directional gate 204 converts the input received at eight binary data lines $D_0$–$D_7$ to four quaternary logic signals $S_0$–$S_3$. Each of the logic signals is converted to a corresponding voltage on a data write line by a data line driver 212. The voltage at each data write line results in one of four charge quantities to be stored on the gate of storage transistor 302 being written. When read, the charge stored on each storage transistor 302 results in one of four possible channel conductivities which induces one of four possible voltages at the outputs of the sense amplifiers 214. For example, the possible output voltages may be 0, V/3, 2V/3, and V, where V is the supply voltage. A/D converters 216 each include three output lines and three reference voltages which maybe V/6, V/2, and 5V/6. Thus, if the output voltage of a particular cell 210 sensed by a sense amplifier 214 is 2V/3, two of the three output lines are asserted by A/D converter 216 (when enabled).

By adjusting the refresh rate of memory cells 210 in accordance with the refresh rate signal from control circuit 108, the proper charged state of each memory cell is maintained while accommodating adequate system performance. Since each cell of memory system 200 stores more than two discrete logical states, relatively high storage density may be achieved.

What is claimed is:

1. A memory circuit comprising:
   a memory array including a plurality of memory cells;
   a refresh circuit coupled to said memory array and configured to refresh said plurality of memory cells;
   a temperature sensor for generating a temperature signal indicative of a temperature; and
   a control circuit coupled to said temperature sensor and to said refresh circuit, wherein said control circuit is configured to generate a refresh rate signal dependent upon said temperature signal generated by said temperature sensor;
   wherein said refresh circuit is configured to vary a rate of said refresh of said of said plurality of memory cells depending upon said refresh rate signal;
   a look-up table unit coupled to said control circuit, wherein said look-up table unit is configured to store a plurality of entries, wherein each of said plurality entries indicates a desired refresh rate for a particular corresponding temperature.

2. The memory circuit as recited in claim 1 wherein said look-up table unit includes a read only memory.

3. The memory circuit as recited in claim 1 further comprising an address decode unit coupled to said memory array, wherein said address decode unit is configured to select a designated row of said memory array depending upon an address signal.

4. The memory circuit as recited in claim 1 further comprising a read/write logic unit configured to enable read and write operations of said memory array.

5. The memory circuit as recited in claim 1, wherein said refresh circuit decreases said refresh rate as said temperature increases.

6. The memory circuit as recited in claim 1 wherein said temperature sensor is situated on a semiconductor die of which said memory array is fabricated.

7. The memory circuit as recited in claim 1 wherein each of said plurality of memory cells in configured to store at least three discrete logic values.

8. A method for refreshing memory cells in a memory circuit comprising:
   sensing a temperature;
   generating a signal indicative of said temperature;
   varying a refresh rate of said memory cells depending upon said signal indicative of said temperature,
   accessing a ROM look-up table to determine a desired refresh rate for said temperature.

9. The method for refreshing memory cells in a memory circuit as recited in claim 8 further comprising sensing one of more than two discrete logic states within each of said plurality of memory cells.

10. The method for refreshing a plurality of memory cells in a memory circuit as recited in claim 8 further comprising increasing said refresh rate in response to a decrease in said temperature.

11. A memory circuit comprising:
    a memory array including a plurality of memory cells, wherein each of said memory cells includes:
        a storage transistor with a first terminal, a second terminal, and a gate, said first terminal coupled to a predetermined voltage;
        a read transistor coupled to said second terminal, said read transistor configured to conduct a current through said storage transistor when a read signal is asserted; and
        a write transistor coupled to said gate, said write transistor configured to store a charge on said gate of said storage transistor when a write signal is asserted;
    an analog-to-digital converter coupled to detect a value indicative of a voltage across said storage transistor, wherein said analog to digital converter is configured to convert said value to one of at least three distinct digital values;
    a refresh circuit coupled to said memory array and configured to refresh said plurality of memory cells;
    a temperature sensor for generating a temperature signal indicative of a temperature; and
    a control circuit coupled to said temperature sensor and to said refresh circuit, wherein said control circuit is configured to generate a refresh rate signal dependent upon said temperature signal generated by said temperature sensor;
    wherein said refresh circuit is configured to vary a rate of said refresh of said plurality of memory cells depending upon said refresh rate signal.

12. The memory circuit as recited in claim 11 further comprising a look-up table unit coupled to said control circuit, wherein said look-up table unit is configured to store a plurality of entries, wherein each of said plurality entries indicates a desired refresh rate for a particular corresponding temperature.

13. The memory circuit as recited in claim 12 wherein said look-up table unit includes a read only memory.

14. The memory circuit as recited in claim 11 wherein said analog-to-digital converter comprises a plurality of comparators, each coupled to compare said input voltage to one of a plurality of reference voltages.

15. The memory circuit as recited in claim 11 further comprising a data line driver coupled to receive one of said distinct digital values, said data line driver configured to responsively provide a write voltage to said write transistor.

16. The memory circuit as recited in claim 11 further comprising an address decoder coupled to said memory array and configured to assert said read signal in response to receiving an address signal and an enable signal.

17. The memory circuit as recited in claim 11 further comprising a bi-directional gate configured to convert n binary data bits into m logic signals during a write operation, wherein each of said logic signals has one of said distinct digital values, said bi-directional gate further configured to convert m logic signals, each having one of said distinct digital values, into n binary data bits during a read operation.

18. The memory circuit as recited in claim 11 further comprising a sense amplifier coupled to detect said current through said storage transistor, said sense amplifier configured to responsively provide said input voltage.

* * * * *

UNITED STATES PATENT AND TRADEMARK OFFICE
CERTIFICATE OF CORRECTION

PATENT NO. : 5,784,328  Page 1 of 1
APPLICATION NO. : 08/779999
DATED : July 21, 1998
INVENTOR(S) : Raymond Tak-Hoi Leung et al.

It is certified that error appears in the above-identified patent and that said Letters Patent is hereby corrected as shown below:

Title page

Item [21] Appl. No.: 779,999, change to -- 08/779,999 --

Column 7, Line 51 Claim 1, from -- said refresh of said of said plurality of memory cells -- change to -- refresh of said plurality of memory cells --

Signed and Sealed this

Twenty-sixth Day of May, 2009

JOHN DOLL
*Acting Director of the United States Patent and Trademark Office*